United States Patent [19]

Johnson et al.

[11] Patent Number: 4,540,620
[45] Date of Patent: Sep. 10, 1985

[54] CONDUCTIVE PATTERNS IN POLYMERIC FILMS

[75] Inventors: Timothy W. Johnson; Mark L. Stone, both of Bartlesville, Okla.

[73] Assignee: Phillips Petroleum Company, Bartlesville, Okla.

[21] Appl. No.: 641,418

[22] Filed: Aug. 17, 1984

Related U.S. Application Data

[63] Continuation of Ser. No. 543,581, Oct. 19, 1983, abandoned.

[51] Int. Cl.$^3$ ................................................. H01B 1/06
[52] U.S. Cl. ..................................... 428/195; 252/500; 427/53.1; 427/96; 428/212; 428/419; 428/901; 430/311; 430/315; 430/945; 430/964; 525/537; 528/388
[58] Field of Search ............................... 427/53.1, 96; 204/159.14; 252/500; 525/537; 528/388; 430/311, 315, 945, 964; 428/195, 212, 419

[56] References Cited

U.S. PATENT DOCUMENTS

| | | | |
|---|---|---|---|
| Re. 30,274 | 5/1980 | Bolon et al. | 361/411 |
| 3,259,520 | 7/1966 | Borman | 252/500 |
| 3,501,342 | 3/1970 | Haberecht et al. | 117/212 |
| 3,634,336 | 1/1972 | Perez-Albuerne | 252/500 |
| 3,930,963 | 1/1976 | Polichette et al. | 204/15 |
| 3,994,727 | 11/1976 | Polichette et al. | 96/38.4 |
| 4,119,480 | 10/1978 | Nishi et al. | 156/272 |
| 4,240,127 | 12/1980 | Fanning et al. | 361/304 |
| 4,339,526 | 7/1982 | Baise et al. | 430/296 |
| 4,344,869 | 8/1982 | Blinne et al. | 252/517 |
| 4,344,870 | 8/1982 | Blinne et al. | 252/500 |
| 4,360,968 | 11/1982 | D'Amico et al. | 29/840 |
| 4,440,669 | 4/1984 | Ivory et al. | 252/500 |

OTHER PUBLICATIONS

Rubner, "Electrically Conducting Polyphenylene Sulfide Prepared by Doping with Nitrosyl Salts from Solution," *J. Electronic Materials*, vol. 11, 1982.

*Primary Examiner*—John H. Newsome
*Attorney, Agent, or Firm*—French & Doescher

[57] ABSTRACT

A method is described for producing electrically-conductive paths in poly(arylene sulfide) and other polymers exhibiting differing receptivity to chemical doping agents depending upon the crystallinity of the polymer structure. Conductivity is selectively induced in amorphous regions by contacting the amorphous regions with a doping agent in solution. Selected areas of crystalline polymers are made amorphous by heat or solvent treatment.

22 Claims, No Drawings

CONDUCTIVE PATTERNS IN POLYMERIC FILMS

This is a continuation of application Ser. No. 543,581, filed Oct. 19, 1983 now abandoned.

BACKGROUND OF THE INVENTION

This invention relates to the formation of electrically-conductive paths in a polymeric object. It further relates to the selective modification of morphology in a polymeric film. In one embodiment, the invention relates to methods for preparing printed circuits boards, integrated circuits and other electrical devices.

The current practice for making conductive paths in such applications as printed circuit boards and integrated circuits generally fall into two categories. One is the etching from a completely conducting sheet the areas desired to be non-conducting. The other method is to metal-coat a substrate while preventing metal contact with non-conducting areas. Such a coating process usually involves plating or vacuum deposition of a metal. Simpler methods and less expensive materials are being sought for such applications.

It is therefore an object of the present invention to produce all-plastic electrical components such as printed circuit boards. It is a further object to provide a method for making conductive paths in a polymeric surface.

SUMMARY OF THE INVENTION

According to the invention, conductive paths on a polymeric surface are produced by selective alteration of the morphology of the polymer in selected areas and subsequent selective inducement of electrical conductivity. In a preferred embodiment of the invention method, a poly(arylene sulfide) film is made receptive to induced conductivity in selected areas, and conductivity is induced in those areas. For example, poly(arylene sulfide)s are receptive to chemical dopant-induced electrical conductivity in the amorphous state but not in the crystalline state. A film of a poly(arylene sulfide) is treated to selectively alter the polymer morphology at sites of desired conductivity or non-conductivity. An amorphous polymeric object can be made crystalline at selected sites of desired non-conductivity and conductivity induced in the untreated areas of the polymer. Alternatively, a crystalline polymer can be made amorphous at selected sites of desired conductivity and conductivity induced at the treated sites. The preferred method of inducing conductivity is chemical doping at the amorphous areas. The invention is useful for the production of printed circuit boards, integrated circuits and other applications requiring patterned electrical conductivity on a substrate.

DETAILED DESCRIPTION OF THE INVENTION

Any polymeric material which exhibits a significant difference in its susceptibility to induced electrical conductance in its different morphological states can be used in the invention method. For reasons of their superior properties and the distinct difference in susceptibility to induced conductivity between the crystalline and amorphous states, poly(arylene sulfides) are the preferred polymers. Crystallinity can be induced in an amorphous poly(arylene sulfide) by, for example, the action of certain solvents, the application of heat, or the use of high-intensity light such as a laser beam, as described below.

The poly(arylene sulfide) useful in the invention article of manufacture can be any polymeric material comprising one or more aryl moieties having sulfide linkages. Suitable starting materials for the polymer are disclosed in U.S. Pat. Nos. 3,354,129 and 3,919,177, the disclosures of which are hereby incorporated by reference. Such polymers include those represented by the formula $(-R-S-)_n$ wherein R is a substituted or unsubstituted benzene ring and n is at least 50. The manufacture of poly(arylene sulfide) is known in the art. A polyhalosubstituted aromatic compound is reacted with a sulfur source in a polar organic solvent. In a commercial form of this process, para-dichlorobenzene is reacted with sodium sulfide in N-methylpyrrolidone solvent. A process for producing high molecular weight, film-grade poly(phenylene sulfide) is described in U.S. Pat. No. 3,919,177. According to the process described therein, p-dichlorobenzene is reacted with sodium sulfide in N-methylpyrrolidone solvent in the presence of an alkali metal carboxylate. The resulting polymer resin has a melt viscosity of 100 to 600,000 poise, preferably 300 to 100,000 poise at 300° C. and a shear rate of 200 $sec^{-1}$.

Suitable polyhalosubstituted aromatic compounds for producing poly(arylene sulfide) polymers and copolymers include 1,2-dichlorobenzene, 1,3-dichlorobenzene, 1,4-dichlorobenzene, 2,5-dichlorotoluene, 1,4-dibromobenzene, 2,5-dibromoaniline, 1,3,5-dichlorobenzene, and the like.

The preferred polymer in terms of its availability and properties is poly(phenylene sulfide), in which R is predominately an unsubstituted benzene ring. Poly(phenylene sulfide) is a thermoplastic polymer having a melting point of about 280° to 290° C. It is available in various forms as Ryton  poly(phenylene sulfide), a product of Phillips Petroleum Company.

The poly(arylene sulfide) of the invention can be a copolymer of two or more aromatic monomers. Referring to the general $(-R-S-)_n$ formula above, the predominate R group in a copolymer will generally be p-phenylene with relatively minor amounts of, for example, aryl moieties such as o-phenylene, m-phenylene, methyl-p-phenylene, dimethyl-p-phenylene, or p, p-biphenylene although these can also comprise the majority of the R groups in a poly(arylene sulfide) polymer. The linkages for the aromatic moieties can include functionalities in addition to sulfide groups $$\overset{O}{\underset{\|}{-C-}}$$

and —O—, for example. Illustrative of suitable poly(arylene sulfide) copolymers are polybiphenyl/phenylene sulfide, polyphenylene sulfide ketone, and poly(thianthrenylene sulfide).

Although the shape and dimensions of the article to be treated are not critical, it is believed that the present most promising utility of the invention lies in the treatment of a polymeric film or sheet having a thickness of from about 1 mil to about 60 mil, generally about 1 mil to about 15 mil for film applications. The description of the process herein will, without limitation, be given in terms of the treatment of a film.

It is possible to treat an amorphous or crystalline polymeric film according to the invention method for producing selective conductivity. The receptivity of a poly(arylene sulfide) to chemical doping is dependent upon the degree to which the polymer is amorphous in structure; therefore, the relatively more crystalline areas of the film will be less conductive after doping of the material. Highly crystalline polymeric regions will be essentially non-conductive. Although "crystalline" and "amorphous" are relative terms, crystalline poly(phenylene sulfide) generally exhibits a crystallinity index (CI), as determined by x-ray diffraction, of about 20 to about 100, while the amorphous polymer exhibits a CI of about 0 to about 20.

The procedure will generally be employed to treat an amorphous poly(arylene sulfide) film by crystallizing designated areas and doping the remaining amorphous areas to produce a pattern of electrical conductivity in the uncrystallized areas. Crystallization of amorphous poly(arylene sulfide) can be effected by a variety of agents, including solvent action, heat and high intensity light. Among the solvents which are effective in producing crystallinity in amorphous poly(arylene sulfide) are dichloromethane, dichloroethane, chloroform, tetrahydrofuran and toluene. The conditions under which the solvent is employed to treat the polymer will vary depending upon the circumstances, but will generally include contact of the polymer with the solvent, including in appropriate cases immersion of the polymer in the solvent. The contacting can occur at room temperature and pressure, with contact time varying with the polymer and conditions. Suitable results will generally be achieved by, for example, contact with a solvent for about 0.5 minutes to about 5 hours under normal conditions.

Selective crystallinity can also be induced in an amorphous polymer by heating the polymer in the areas chosen for conductivity. Generally, temperatures above about 150° C. are effective for producing crystallinity in poly(phenylene sulfide), for example.

Alternatively, the poly(arylene sulfide) can be selectively crystallized by use of a high-intensity light beam such as a laser. Because of its ability to produce rapid, localized heating of the substrate, this is the presently preferred method for producing intricate patterns of conductivity on amorphous poly(arylene sulfide). Suitable conditions for such treatment will of course vary with the light source and other conditions, but will generally include a light intensity of about 0.1 joules/cm$^2$ to about 5 J/cm$^2$, with single or multiple pulses at about a 1 Hz repeat rate. The laser treatment can be carried out in air or other desired atmosphere. A pulsed carbon dioxide laser has been found effective in producing selective changes in crystallinity in poly(arylene sulfide).

It is also possible to use a crystalline poly(arylene sulfide) as the starting material for the invention process. Amorphous regions in a crystalline film can be produced by, for example, heating the regions and immediately quenching the heated polymer to freeze the amorphous state into the heated regions. Any method for quickly lowering the temperature of the heated polymer can be used, including immersion of the polymer in cold water. Gradual cooling of a polymer such as poly(phenylene sulfide), by contrast, results in the formation of a crystalline structure in the heated areas.

A presently preferred procedure for producing selected areas of amorphous poly(arylene sulfide) in a crystalline film is to attach the crystalline film to a backplate which can be cooled or refrigerated. The film affixed to the backplate is subjected to one or more pulses of high-intensity light such as produced by a pulsed $CO_2$ laser. The heat from the absorbed laser pulse(s) melts target areas of the film, and the cold backplate immediately quenches these areas into an amorphous state.

The polymer is then subjected to induced conductivity, such as contact with a chemical dopant. The amorphous areas are rendered conductive, and the crystalline areas remain non-conductive, thus producing an article exhibiting electrical conductivity over selected areas. Such a method of selectively inducing electrical conductivity has application in producing printed circuit boards and integrated circuits.

EXAMPLE I

Eight samples of thin PPS film were rendered electroconductive by post-fabrication doping. The film used in this example was a high molecular weight slightly branched, poly(phenylene sulfide) having a flow rate of 50–70 g/10 min. The sample films varied in thickness from about 10 to 40 mils. Initially the film had a crystallinity index of 5.0, indicating that it was essentially amorphous.

The dopant employed was nitrosonium hexafluorophosphate ($NOPF_6$) obtained from Ozark-Mahoning. $NOPF_6$ was added to a 70/30 volume ratio of nitromethane and methylene chloride. The doping solution was prepared under an inert atmosphere.

The doping procedure involved immersing the sample films in the doping mixture at room temperature. The doping was performed within a glove bag, and the doping mixture was stirred occasionally during the immersion period. Experimental conditions and results are shown in Table I.

After removal of the films from the doping solution, the samples were rinsed in pure nitromethane, and were then placed in a vacuum chamber and pumped dry. The conductivity of each sample was determined by placing the sample into a specially-constructed sample holder which pressed two platinum contact wires each 1 cm long and separated by 1 cm onto the surface of the film. Using a potential of six volts, measured with a Kiethley 173A meter, the current passing through the sample was measured with a Kiethly model 610 electrometer. Resistance, bulk resistivity and bulk conductivity of each sample were calculated from the measured current.

TABLE I

| Sample Number | Experimental Conditions | | | | | Results Conductivity ($\Omega^{-1}cm^{-1}$) |
|---|---|---|---|---|---|---|
| | $NOPF_6$ g/100 ml[1] | Doping Time (min.) | CI[2] | Draw Ratio[3] | Heat Set | |
| 1 | 0.98 | 70 | — | — | — | $1.4 \times 10^{-2}$ |
| 2 | 0.71 | 30 +20 | 15 | 2× | — | $3.0 \times 10^{-5}$ $9.0 \times 10^{-4}$ |
| 3 | 0.71 | 60 | 24 | 4× | — | $2.8 \times 10^{-7}$ |
| 4 | 1.48 | 60 | 18 | 0 | no | $1.4 \times 10^{-2}$ |
| 5 | 1.48 | 60 | 20 | 3.5× | no | $1.4 \times 10^{-5}$ |
| 6 | 1.48 | 60 | 84 | 3.5× | yes | $3.0 \times 10^{-9}$ |
| 7 | 1.55 | 60 | 66 | — | — | $2.5 \times 10^{-7}$ |
| 8 | 1.55 | 60 | 75 | — | — | too low to read |

[1]Added to A70/30 by volume mixture of nitromethane/methylene chloride.
[2]Crystallinity Index measured using a x-ray diffraction technique.
[3]Certains of the samples were biaxially drawn.

EXAMPLE II

A thin piece of basically-oriented, amorphous film was placed between two blocks of wood with holes drilled in them. The output of a heat gun was directed at the exposed portion of the film, causing it to crystalize. The crystallized state of the film was noted by observing the film through cross polarizers in a microscope. After exposure to the doping media, as in Example I, the regions of the film masked by the wood turned black and were quite conductive, whereas the heat treated portion of the film remained clear and non-conductive.

EXAMPLE III

The output from a pulsed $CO_2$ laser was directed at a thin amorphous PPS film partially masked by a metal template having the word "MEMO" cut out of it. After 15 pulses, the mask was removed. The film was examined under a microscope using cross polarizers. Separate crystalline and amorphous regions could easily be distinguished. The film was doped as in Example I and the words appeared clear against a black conductive background.

Another piece of amorphous film was masked with a fine metal frame where the pattern in places was as narrow as 90 μm. After exposure to the laser and subsequent doping, clearly defined conductive lines were present.

EXAMPLE IV

Thin pieces of crystalline film were attached to a large test tube filled with air, ice water, or dry ice. The exposed areas were heated by a pulsed laser beam and quenched by the cool tube, yielding amorphous regions of polymer in an otherwise crystalline film. The films were doped and only the laser treated areas turned black and conductive ($10^{-2}$ to $10^{-3}$ ohms$^{-1}$cm$^{-1}$).

EXAMPLE V

Even finer conductive lines were produced on PPS film, utilizing the electron beam of a scanning electron microscope (SEM) to convert the initially crystalline film to the amorphous form. Pieces of thin highly crystalline film were masked in a variety of patterns and metal contact pads were deposited in a vacuum metallizing apparatus. The films were transferred to the SEM. At a current of 5 to $9 \times 10^{-8}$ A, the sample was moved back and forth for 10 min. under the beam in such a way so as to connect two metal contact pads with the line drawn by the beam. Upon doping, only the line became black and conductive. The line varied in thickness from about 0.03 to 0.08 mm.

EXAMPLE VI

Solvent control of morphology was utilized to produce crystallinity patterns in a PPS film. Simple tape masks applied to the film prior to painting the film with methylene chloride were effective in controlling the areas of solvent-induced crystallization. After the solvent treatment the tape was removed and the samples doped in the usual fashion. A variety of conductive lines, figures and shapes were produced using this technique.

We claim:

1. A method for producing conductive paths on a poly(arylene sulfide) object comprising:

altering the polymer morphology of selected areas of the object so as to produce in such areas relatively lesser polymer crystallinity; and selectively inducing electrical conductivity in said areas of lesser polymer crystallinity.

2. The method of claim 1 in which electrical conductivity is selectively induced by chemical doping of the areas of lesser polymer crystallinity.

3. The method of claim 1 in which the polymer morphology is altered by heating the selected areas to a temperature above the melting temperature of the poly(arylene sulfide).

4. The method of claim 1 in which the polymer morphology is altered by a solvent effective for reducing the crystallinity of the poly(arylene sulfide).

5. The method of claim 1 in which the polymer morphology is altered by contact of the selected areas with a high-intensity light beam.

6. The method of claim 1 in which the selected areas exhibit a crystallinity of less than about 15, as determined by x-ray, after alteration of the polymer morphology.

7. The method of claim 6 in which electrical conductivity is selectively induced by chemical doping using a doping agent in a liquid solvent effective for increasing the crystallinity of the poly(arylene sulfide).

8. The method of claim 6 in which electrical conductivity is selectively induced by doping the areas of relatively lesser polymer crystallinity with nitrosonium hexafluorophosphate.

9. The method of claim 8 in which the nitrosonium hexafluorophosphate is present in a liquid effective for increasing the crystallinity of the poly(arylene sulfide).

10. The method of claim 9 in which the polymer morphology is altered by contact of the poly(arylene sulfide) with a pulsed carbon dioxide laser beam.

11. A method comprising:

contacting selected areas of a poly(phenylene sulfide) film with a pulsed laser beam having an intensity of at least about 0.1 joules/cm so as to heat the selected areas to a temperature above the melting point of the poly(phenylene sulfide);

cooling the selected areas so as to produce in the selected areas a crystallinity different from that of the non-heated areas of the poly(phenylene sulfide) film;

chemically doping those areas of the thus-treated poly(phenylene sulfide) film having a relatively lower level of crystallinity with a doping agent effective to increase the electrical conductivity of the doped areas of the poly(phenylene sulfide).

12. The method of claim 11 in which the areas contacted with the pulsed laser beam are quenched so as to produce areas of relatively low crystallinity in the poly(phenylene sulfide).

13. The method of claim 11 in which the areas contacted with the pulsed laser beam are cooled so as to produce areas of relatively high crystallinity in the poly(phenylene sulfide).

14. A method comprising:

contacting selected areas of a poly(arylene sulfide) film with a pulsed laser beam so as to heat the contacted areas to a temperature above that of the melting temperature of the poly(arylene sulfide);

simultaneously, contacting the opposite side of the film with a substrate having a temperature effective for reducing the temperature of the film at a rate which will freeze thus-heated areas in an amorphous polymeric state; and inducing electrical conductivity selectively in the thus-produced amorphous areas.

15. The method of claim 14 in which electrical conductivity is selectively induced by contacting the amorphous areas with a solution of a doping agent.

16. The method of claim 15 in which the doping agent is nitrosonium hexafluorophosphate.

17. An article of manufacture comprising a poly(arylene sulfide) film, the film comprising (a) regions of amorphous poly(arylene sulfide), (b) regions of crystalline poly(arylene sulfide), and (c) a chemical doping agent present in the regions of amorphous poly(arylene sulfide).

18. The article of manufacture of claim 17 in which the poly(arylene sulfide) is poly(phenylene sulfide).

19. The article of manufacture of claim 18 in which the chemical doping agent is nitrosonium hexafluorophosphate.

20. The article of manufacture of claim 17 in which the chemical doping agent is confined essentially to the regions of amorphous poly(arylene sulfide).

21. A printed circuit board comprising the article of manufacture of claim 17.

22. An integrated circuit comprising the article of manufacture of claim 17.

* * * * *